United States Patent
Jo

(10) Patent No.: US 11,976,353 B2
(45) Date of Patent: May 7, 2024

(54) TANTALUM CARBIDE-COATED CARBON MATERIAL AND METHOD FOR MANUFACTURING SAME

(71) Applicant: TOKAI CARBON KOREA CO., LTD, Gyeonggi-do (KR)

(72) Inventor: Dong Wan Jo, Gyeonggi-do (KR)

(73) Assignee: Tokai Carbon Korea Co., Ltd, Gyeonggi-do (KR)

( * ) Notice: Subject to any disclaimer, the term of this patent is extended or adjusted under 35 U.S.C. 154(b) by 0 days.

(21) Appl. No.: 17/539,496

(22) Filed: Dec. 1, 2021

(65) Prior Publication Data
US 2022/0170150 A1 Jun. 2, 2022

(30) Foreign Application Priority Data
Dec. 1, 2020 (KR) .................. 10-2020-0165748

(51) Int. Cl.
*C23C 16/32* (2006.01)
*C23C 16/02* (2006.01)
*C23C 16/52* (2006.01)
*C30B 35/00* (2006.01)

(52) U.S. Cl.
CPC .......... *C23C 16/32* (2013.01); *C23C 16/0254* (2013.01); *C23C 16/52* (2013.01); *C30B 35/00* (2013.01)

(58) Field of Classification Search
None
See application file for complete search history.

(56) References Cited

U.S. PATENT DOCUMENTS

| 2010/0239885 | A1 | 9/2010 | Nakamura |
| 2012/0040172 | A1 | 2/2012 | Fujiwara |
| 2012/0301723 | A1* | 11/2012 | Kondo ............... C30B 25/02 428/408 |
| 2019/0169768 | A1* | 6/2019 | Mori ............... C23C 16/56 |

FOREIGN PATENT DOCUMENTS

| CN | 101445392 A | 6/2009 |
| CN | 109896515 A | 6/2019 |
| CN | 110072963 A | 7/2019 |
| CN | 111825478 A | 10/2020 |
| EP | 1852407 A1 | 11/2007 |
| EP | 3670450 A1 | 6/2020 |
| JP | 2006348388 A | 12/2006 |
| JP | 2007308370 A * | 11/2007 |
| KR | 20190073788 A | 6/2019 |
| KR | 20200074771 A | 6/2020 |
| WO | WO-2017204535 A1 * | 11/2017 ........ C01B 32/914 |

* cited by examiner

*Primary Examiner* — Seth Dumbris
(74) *Attorney, Agent, or Firm* — KDW Firm PLLC

(57) ABSTRACT

The present disclosure relates to a tantalum carbide-coated carbon material and a method for manufacturing the same, and an aspect of the present disclosure provides a tantalum carbide-coated carbon material including: a carbon substrate; and a tantalum carbide coating layer formed on the carbon substrate by a CVD method, wherein microcracks included in the tantalum carbide coating layer have a maximum width of 1.5 μm to 2.6 μm.

10 Claims, 7 Drawing Sheets

TANTALUM CARBIDE-COATED CARBON MATERIAL AND METHOD FOR MANUFACTURING SAME

CROSS-REFERENCE TO RELATED APPLICATION

This application claims the benefit of Korean Patent Application No. 10-2020-0165748 filed on Dec. 1, 2020, in the Korean Intellectual Property Office, the entire disclosure of which is incorporated herein by reference for all purposes.

BACKGROUND

1. Field of the Invention

One or more example embodiments relate to a tantalum carbide-coated carbon material and a method for manufacturing the same.

2. Description of the Related Art

A carbon material exposed to a corrosive gas atmosphere in a high temperature environment is deteriorated or damaged by a reaction with a corrosive gas so that if it is not frequently exchanged, a problem that it cannot perform the original function required for the carbon material occurs.

For example, when a product made of a carbon material is disposed within a furnace and the inside of the furnace is heated to about 1,200° C. while forming an ammonia atmosphere by introducing an ammonia gas into the furnace, the product made of a carbon material is consumed in a short time due to hydrogen gas decomposed in ammonia, shortening its lifespan.

In order to solve such a lifespan problem, a tantalum carbide composite coated with tantalum carbide on the surface of a carbon material is used, but cracks are inevitably generated due to a difference in physical properties between a tantalum carbide coating layer and the carbon material, and in particular, there is a problem in that microcracks are generated due to a difference in the coefficient of thermal expansion. That is, as a corrosive gas penetrates between the generated microcracks and damages a carbon substrate, there is a problem in that the lifespan of parts are shortened.

There is also a carbon material having properties similar to those of the tantalum carbide coating layer, but it is necessary to use a carbon material having properties (coefficient of thermal expansion) similar to those of single-crystalline SiC for parts used in the single-crystalline SiC process.

Therefore, in a carbon material-based tantalum carbide coating composite having properties similar to those of SiC, it is necessary to develop a technology capable of increasing the lifespans of the parts by reducing the width of microcracks of the tantalum carbide coating layer.

The above description has been possessed or acquired by the inventor(s) in the course of conceiving the present disclosure and is not necessarily an art publicly known before the present application is filed.

SUMMARY

In order to solve the aforementioned problems, example embodiments provide a tantalum carbide-coated carbon material having a reduced width of microcracks generated in a tantalum carbide coating layer, and a method for manufacturing the same.

However, the problems to be solved by the present disclosure are not limited to those mentioned above, and other problems not mentioned will be able to be clearly understood by those skilled in the art from the following description.

According to an aspect, there is provided a tantalum carbide-coated carbon material including: a carbon substrate; and a tantalum carbide coating layer formed on the carbon substrate by a CVD method, in which microcracks included in the tantalum carbide coating layer have a maximum width of 1.5 μm to 2.6 μm.

According to an example embodiment, the carbon substrate may include one or more selected from the group consisting of graphene, graphite, and fullerene.

According to an example embodiment, the carbon substrate may have a thermal expansion coefficient of $4.0 \times 10^{-6}/° C.$ to $5.0 \times 10^{-6}/° C.$ According to an example embodiment, the carbon substrate may have a surface roughness (Ra) of 0.6 μm to 10 μm.

According to an example embodiment, the carbon substrate may be surface-pretreated, and the pretreatment may include one or more selected from the group consisting of plasma treatment, ultrasonic treatment, acid treatment, sandblasting, and grinding treatment.

According to an example embodiment, the carbon substrate may include surface pores, and may be one in which a tantalum carbide is penetrated into the carbon substrate through the surface pores of the carbon substrate.

According to an example embodiment, the tantalum carbide may have a penetration depth of 30 μm to 150 μm.

According to an example embodiment, the surface pores of the carbon substrate may have a diameter of 1 μm to 50 μm.

According to an example embodiment, the tantalum carbide coating layer may have a thickness of 10 μm to 40 μm.

According to another aspect, there is provided a method for manufacturing a tantalum carbide-coated carbon material, the method including the steps of: preparing a carbon substrate; and forming a tantalum carbide coating layer on the carbon substrate by a CVD method, in which microcracks included in the tantalum carbide coating layer have a maximum width of 1.5 μm to 2.6 μm.

According to an example embodiment, after the step of preparing the carbon substrate, the method may further include a step of pretreating the surface of the carbon substrate with one or more methods selected from the group consisting of plasma treatment, ultrasonic treatment, acid treatment, sandblasting, and grinding treatment.

According to an example embodiment, the step of forming the tantalum carbide coating layer on the carbon substrate by the CVD method may be penetrating the tantalum carbide into the carbon substrate through the surface pores of the carbon substrate, and the tantalum carbide may have a penetration depth of 30 μm to 150 μm.

Additional aspects of example embodiments will be set forth in part in the description which follows and, in part, will be apparent from the description, or may be learned by practice of the disclosure.

According to example embodiments, the tantalum carbide-coated carbon material according to the present disclosure has effects of suppressing damage to the carbon substrate due to a high temperature corrosive gas and enabling lifespans of carbon material-used manufacturing equipment parts, devices, etc. to be increased by reducing the width of microcracks generated in the tantalum carbide coating layer, thereby minimizing the gas permeating through the microcracks.

The method for manufacturing a tantalum carbide-coated carbon material according to the present disclosure has an effect that it can efficiently control the width of microcracks generated in the tantalum carbide coating layer by controlling process conditions, thickness of the coating layer, surface roughness of the carbon substrate, etc. when forming a tantalum carbide coating layer.

BRIEF DESCRIPTION OF THE DRAWING

These and/or other aspects, features, and advantages of the invention will become apparent and more readily appreciated from the following description of example embodiments, taken in conjunction with the accompanying drawings of which.

DETAILED DESCRIPTION

Figure 1:
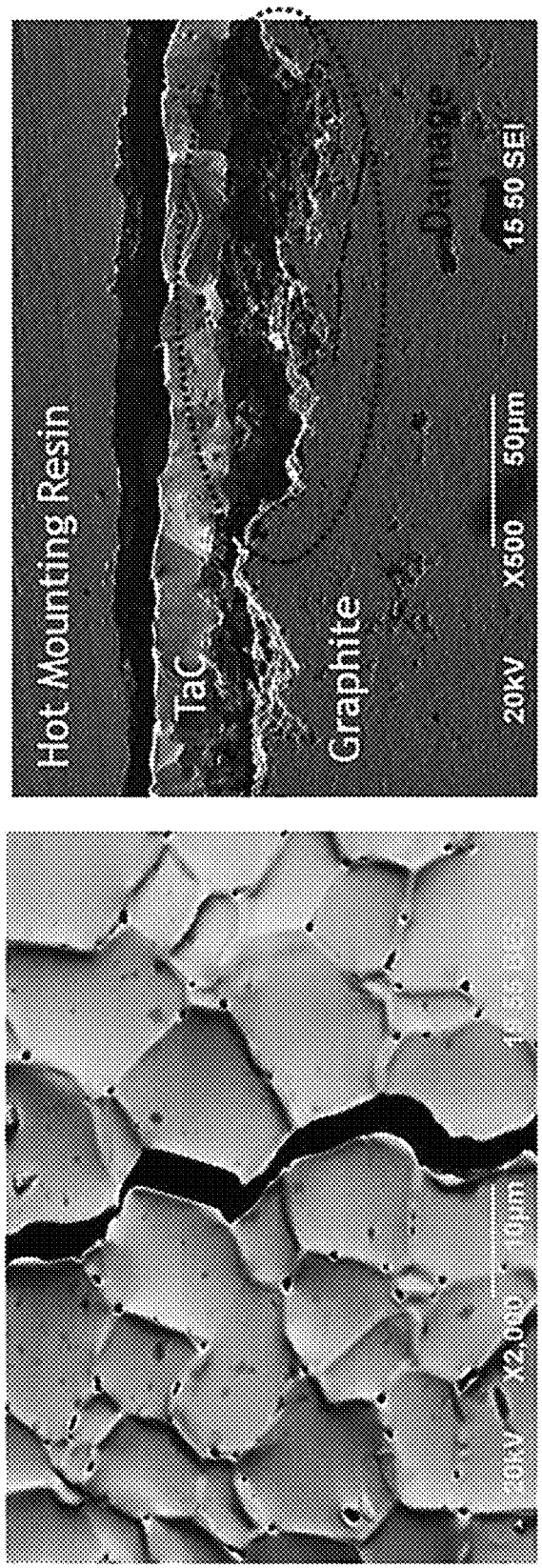
FIG. 1 is images showing the microcrack shape of the tantalum carbide coating layer of Comparative Example 1 and the degree of damage to a carbon substrate after using the tantalum carbide-coated carbon material in a single-crystalline SiC growth process in a tantalum carbide-coated carbon material according to the conventional art.

Hereinafter, embodiments will be described in detail with reference to the accompany drawings. However, since various changes may be made to the embodiments, the scope of rights of the patent application is not restricted or limited by these embodiments. It should be understood that all modifications, equivalents, and substitutes for the embodiments are included in the scope of the rights.

The terms used in the embodiments are used for the purpose of description only, and should not be construed as an intention to limit the present disclosure. The singular expression includes the plural expression unless the context clearly dictates otherwise. In the present specification, it should be understood that a term such as "comprise", or "have" is intended to designate that a feature, a number, a step, an operation, a component, a part, or a combination thereof described in the specification exists, but it does not preclude the possibility of existence or addition of one or more other features, numbers, steps, operations, components, parts, or combinations thereof in advance.

Unless defined otherwise, all terms used herein, including technical or scientific terms, have the same meaning as those commonly understood by those skilled in the art to which the embodiments belong. Terms such as those defined in a commonly used dictionary should be interpreted as having a meaning consistent with the meaning in the context of the related art, and should not be interpreted in an ideal or excessively formal meaning unless explicitly defined in the present application.

Further, in the description with reference to the accompanying drawings, the same components are assigned the same reference numerals regardless of the reference numerals, and overlapping descriptions thereof will be omitted. In the description of the embodiments, if it is determined that a detailed description of a related known technology may unnecessarily obscure the gist of the embodiments, the detailed description thereof will be omitted.

Further, in describing constituent elements of the embodiments, terms such as first, second, A, B, (a), (b), etc. may be used. These terms are only for distinguishing the constituent elements from other constituent elements, and essences, orders, sequences, or the like of the corresponding constituent elements are not limited by the terms. When it is described that a constituent element is "linked", "coupled", or "connected" to other constituent element, the constituent element may be directly linked or connected to the other constituent element, but it should be understood that another constituent element may also be "linked", "coupled", or "connected" between the respective constituent elements.

Constituent elements included in any an embodiment and constituent elements including a common function will be described using the same names in other embodiments. Unless otherwise stated, descriptions described in any an embodiment may also be applied to other embodiments, and detailed descriptions will be omitted in the overlapping range.

An aspect of the present disclosure provides a tantalum carbide-coated carbon material including: a carbon substrate; and a tantalum carbide coating layer formed on the carbon substrate, in which microcracks included in the tantalum carbide coating layer have a maximum width of 1.5 μm to 2.6 μm. The tantalum carbide coating layer may be formed by a CVD method.

The maximum width of the microcracks refers to a portion with the largest crack width of microcracks generated in a carbon material including a tantalum carbide coating layer, and the width of the cracks is measured by observing the image of a crack region using SEM analysis equipment and measuring the gap between the cracks in the vertical direction (SEM model name: JEOL, JSM-6390).

The tantalum carbide-coated carbon material according to the present disclosure has a feature that the width of microcracks generated in the tantalum carbide coating layer is reduced compared to a conventional tantalum carbide-coated carbon material, thereby minimizing the gas penetrating between the microcracks when exposed to a corrosive gas in a high temperature environment so that the degree of damage to the carbon substrate may be reduced, and the lifespans of parts in which the tantalum carbide-coated carbon material is used may be ultimately increased.

Further, since the adhesion between the carbon substrate and the tantalum carbide coating layer is increased, it is possible to prevent a phenomenon that the tantalum carbide coating layer is peeled off from the carbon substrate in a high-temperature environment.

According to an embodiment, the carbon substrate may include one or more selected from the group consisting of graphene, graphite, and fullerene.

According to an embodiment, the carbon substrate may have a thermal expansion coefficient of $4.0 \times 10^{-6}/°$ C. to $5.0 \times 10^{-6}/°$ C.

The thermal expansion coefficient value is a value measured in a range of room temperature to about 400° C. with a thermal expansion coefficient measuring instrument (DIL 402C).

The carbon substrate has a thermal expansion coefficient similar to that of single-crystalline SiC, and in particular, may be suitably used as a part material for single-crystalline SiC Epitaxy/Growth equipment.

In general, in a carbon material in which a tantalum carbide coating layer is formed on a carbon substrate, microcracks are generated in the tantalum carbide coating layer due to internal and external factors. Here, the internal factors include the presence of impurities inside the material, lattice mismatch, dislocation, phase change, expansion and contraction of grains, etc., and the external factors include factors such as interactions between heterogeneous materials. In particular, when using a carbon substrate having similar physical properties (thermal expansion coefficient) to single-crystalline SiC, the generation of microcracks in the tantalum carbide coating layer is inevitable so that it is necessary to reduce it.

Although the tantalum carbide-coated carbon material according to the present disclosure has a thermal expansion coefficient similar to that of single-crystalline SiC, the maximum microcrack width is controlled to 1.5 μm to 2.6 μm, thereby having an effect of enabling the lifespan of parts using the carbon material to be increased.

According to an embodiment, the tantalum carbide coating layer may have a thermal expansion coefficient of $6.5 \times 10^{-6}/°$ C. to $7.5 \times 10^{-6}/°$ C.

According to an embodiment, the carbon substrate may have a surface roughness (Ra) of 0.6 μm to 10 μm.

Preferably, the carbon substrate may have a surface roughness (Ra) of 0.8 μm to 10 μm, more preferably 1 μm to 10 μm, and even more preferably 1 μm to 8 μm.

When the surface roughness of the carbon substrate is less than the above range, adhesion to the tantalum carbide coating layer may be lowered, and when it exceeds the above range, the width of the microcracks may increase.

According to an embodiment, the carbon substrate may be surface-pretreated, and the pretreatment may include one or more selected from the group consisting of plasma treatment, ultrasonic treatment, acid treatment, sandblasting, and grinding treatment.

Through the surface pretreatment, the carbon substrate may adjust the surface roughness (Ra) of the carbon substrate, form pores on the surface of the carbon substrate, or remove impurities inside the pores that have already been formed.

The surface roughness of the carbon substrate may be adjusted in order to improve the width of microcracks generated in the tantalum carbide coating layer and adhesion to the tantalum carbide coating layer.

Further, the pores on the surface of the carbon substrate may serve to allow a tantalum carbide to penetrate into the carbon substrate in the process of forming the tantalum carbide coating layer.

According to an embodiment, the carbon substrate may include surface pores, and the tantalum carbide may penetrate into the carbon substrate through the surface pores of the carbon substrate.

The tantalum carbide penetrated into the carbon substrate may act like the root of a plant, thereby enabling adhesion between the tantalum carbide coating layer and the carbon substrate to be increased.

Accordingly, it is possible to prevent a phenomenon in which the tantalum carbide coating layer is peeled off from the carbon substrate when the high-temperature process is in progress.

The penetration depth of the tantalum carbide is a penetration depth of the tantalum carbide penetrated inside through the surface pores of the carbon substrate, and may mean a length in the depth direction from the surface of the carbon substrate.

The penetration depth of the tantalum carbide may affect the width of microcracks generated in the tantalum carbide coating layer and the adhesion between the tantalum carbide coating layer and the carbon substrate. Therefore, controlling the penetration depth of the tantalum carbide may be an important factor in controlling the width of the microcracks generated in the tantalum carbide coating layer and the adhesion between the tantalum carbide coating layer and the carbon substrate.

According to an embodiment, the tantalum carbide may have a penetration depth of 30 μm to 150 μm.

Preferably, the tantalum carbide may have a penetration depth of 40 μm to 150 μm, more preferably 50 μm to 150 μm, and even more preferably 50 μm to 130 μm.

When the tantalum carbide has a penetration depth of less than the above range, the width of the microcracks generated in the tantalum carbide coating layer may increase, and the adhesion between the carbon substrate and the tantalum carbide coating layer may be weakened so that the tantalum carbide coating layer may be peeled off when the high-temperature process is in progress.

When the tantalum carbide has a penetration depth of exceeding the above range, the process is performed at low temperatures in order to deeply penetrate the tantalum carbide, which may cause a problem that crystallinity is dropped, and accordingly the physical properties of the tantalum carbide coating layer may be affected.

According to an embodiment, the surface pores of the carbon substrate may have a diameter of 1 μm to 50 μm, and preferably 10 μm to 30 μm.

If the surface pores of the carbon substrate have a diameter of less than the above range, penetration of the tantalum carbide is not sufficiently achieved so that the carbide may not be formed in the form of the root of a plant inside the carbon substrate or may not be formed to a sufficient depth.

On the other hand, when the surface pores of the carbon substrate have a diameter of exceeding the above range, the durability of the carbon material may be lowered, or the adhesion between the carbon substrate and the tantalum carbide coating layer may be rather weakened.

According to an embodiment, the tantalum carbide coating layer may have a thickness of 10 μm to 40 μm.

Preferably, the tantalum carbide coating layer may have a thickness of 15 μm to 40 μm, and more preferably 15 μm to 35 μm.

When the tantalum carbide coating layer has a thickness of less than or exceeding the above range, the width of the microcracks generated in the tantalum carbide coating layer may increase.

Further, when the tantalum carbide coating layer has a thickness of less than the above range, a problem that impurities are inflowing (outgassing) from the substrate may occur, and when it has a thickness of exceeding the above range, the generation of the microcracks may increase.

Another aspect of the present disclosure provides a method for manufacturing a tantalum carbide-coated carbon material, the method including the steps of: preparing a carbon substrate; and forming a tantalum carbide coating layer on the carbon substrate by a CVD method, in which microcracks included in the tantalum carbide coating layer have a maximum width of 1.5 µm to 2.6 µm.

In the method for manufacturing the tantalum carbide-coated carbon material according to the present disclosure, the tantalum carbide coating layer is formed on the surface of the carbon substrate by a chemical vapor deposition (CVD) method, and the maximum width of the microcracks generated in the formed tantalum carbide coating layer is controlled to 1.5 µm to 2.6 µm.

In the step of forming the tantalum carbide coating layer by the CVD method, a Ta precursor material and a C precursor material generally used may be used in performing a CVD process.

Tantalum-based halogen compounds such as $TaCl_5$, $TaCl_2$, $TaO_2$, $TaO_5$, etc. may be used as the Ta precursor material, and carbon-based gas compounds such as $CH_4$, $C_2H_2$, $C_3H_8$, etc. may be used as the C precursor material.

According to an embodiment, after the step of preparing the carbon substrate, the method may further include a step of pretreating the surface of the carbon substrate with one or more methods selected from the group consisting of plasma treatment, ultrasonic treatment, acid treatment, sandblasting, and grinding treatment.

Through the surface pretreatment of the carbon substrate, the pretreatment process may adjust the surface roughness (Ra) of the carbon substrate, form pores on the surface of the carbon substrate, or remove impurities inside the pores that have already been formed.

The surface roughness of the carbon substrate may be adjusted in order to improve the width of the microcracks generated in the tantalum carbide coating layer and the adhesion to the tantalum carbide coating layer.

Further, the pores on the surface of the carbon substrate may serve to allow the tantalum carbide to penetrate into the carbon substrate in the process of forming the tantalum carbide coating layer.

According to an embodiment, the step of forming the tantalum carbide coating layer on the carbon substrate by the CVD method may be penetrating the tantalum carbide into the carbon substrate through the surface pores of the carbon substrate, and the tantalum carbide may have a penetration depth of 30 µm to 150 µm.

The method for manufacturing the tantalum carbide-coated carbon material according to the present disclosure is characterized in that the penetration depth of tantalum carbide penetrating into the carbon substrate may be easily controlled by forming the tantalum carbide coating layer on the carbon substrate by the chemical vapor deposition (CVD) method.

Another aspect of the present disclosure provides a part including the tantalum carbide-coated carbon material.

According to an embodiment, the part may be a manufacturing equipment part, and the manufacturing equipment part may be a part of LED manufacturing equipment or semiconductor manufacturing equipment.

Hereinafter, the present disclosure will be described in more detail by Examples and Comparative Examples.

However, the following Examples are only for illustrating the present disclosure, and the content of the present disclosure is not limited to the following Examples.

EXPERIMENTAL EXAMPLE 1

Comparative Observation of Microcrack Shapes and Degrees of Damage to Carbon Substrate After Using Tantalum Carbide-Coated Carbon Material in Single-Crystalline SiC Growth Process Microcrack shapes of the tantalum carbide coating layer of the tantalum carbide-coated carbon material according to the conventional art and the tantalum carbide-coated carbon material according to an embodiment of the present disclosure and degrees of damage to the carbon substrate after using the tantalum carbide-coated carbon material in the single-crystalline SiC growth process were comparatively observed.

The position of microcracks was analyzed with scanning electron microscope (SEM) equipment, and the gap between the microcracks was measured in the vertical direction to measure the maximum microcrack width.

FIG. 1 is images showing the microcrack shape of the tantalum carbide coating layer of Comparative Example 1 and the degree of damage to a carbon substrate after using the tantalum carbide-coated carbon material in a single-crystalline SiC growth process in a tantalum carbide-coated carbon material according to the conventional art.

Figure 2:
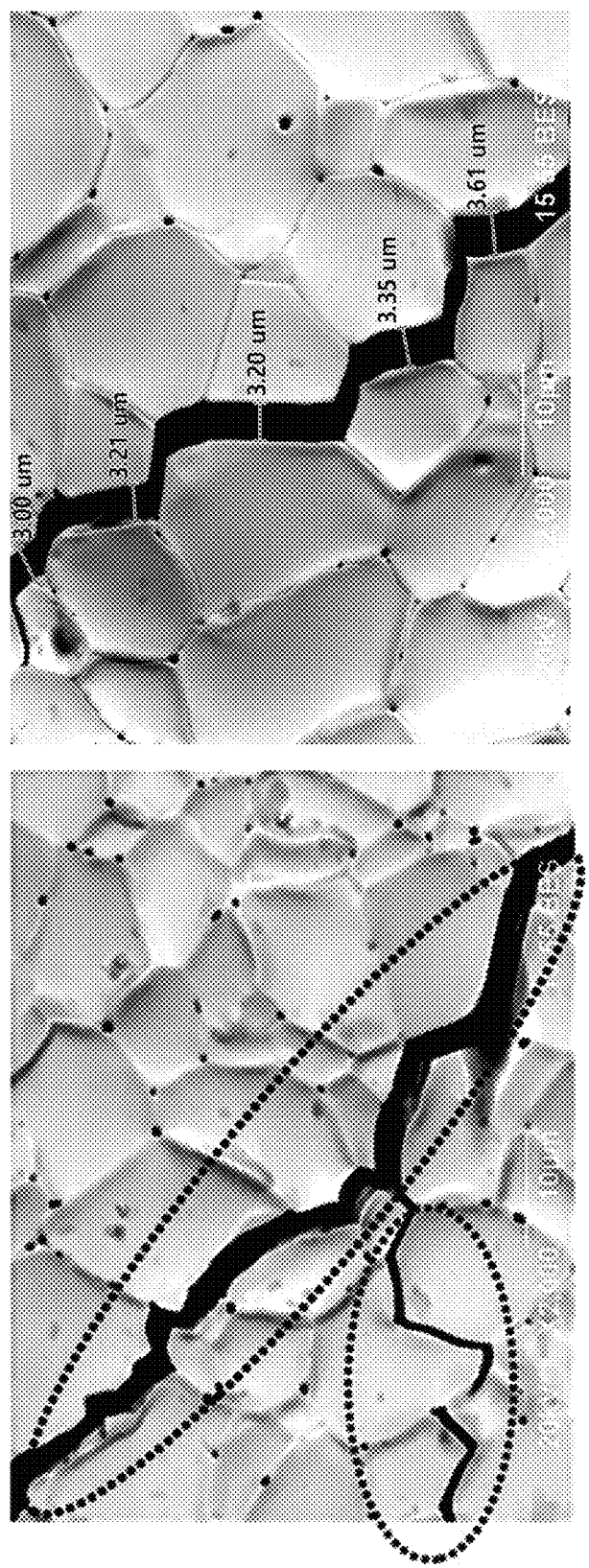
FIG. 2 is images of measuring the microcrack shape and the microcrack width of the tantalum carbide coating layer of Comparative Example 1 in the tantalum carbide-coated carbon material according to the conventional art.

FIG. 2 is images of measuring the microcrack shape and the microcrack width of the tantalum carbide coating layer of Comparative Example 1 in the tantalum carbide-coated carbon material according to the conventional art.

Referring to FIGS. 1 and 2, it may be confirmed from the tantalum carbide-coated carbon material according to the conventional art that microcracks generated in the tantalum carbide coating layer have a wide width, and the degree of damage to the carbon substrate (graphite) after using the tantalum carbide-coated carbon material in a single-crystalline SiC growth process is severe.

A wide part and a narrow part of the microcracks may be confirmed to coexist within the tantalum carbide coating layer, and a corrosive gas penetrates into the wide part of the cracks and damages the substrate (graphite).

In the tantalum carbide-coated carbon material according to the conventional art, when the gap between microcracks generated in the tantalum carbide coating layer was measured in the vertical direction, the microcracks were measured to have a width level of 3.0 µm to 3.61 µm.

Figure 3:
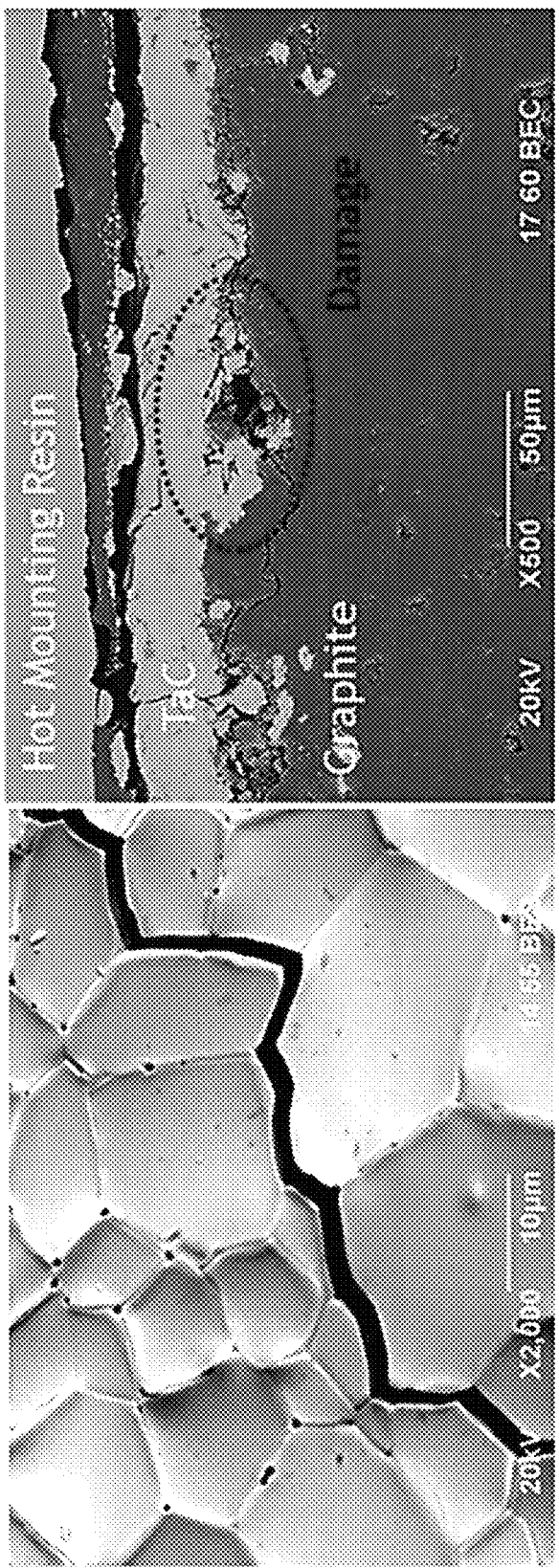
FIG. 3 is images showing the microcrack shape of the tantalum carbide coating layer of Example 1 and the degree of damage to the carbon substrate after using the tantalum carbide-coated carbon material in the single-crystalline SiC growth process in a tantalum carbide-coated carbon material according to an embodiment of the present disclosure.

FIG. 3 is images showing the microcrack shape of the tantalum carbide coating layer of Example 1 and the degree of damage to the carbon substrate after using the tantalum carbide-coated carbon material in the single-crystalline SiC growth process in a tantalum carbide-coated carbon material according to an embodiment of the present disclosure.

Figure 4:
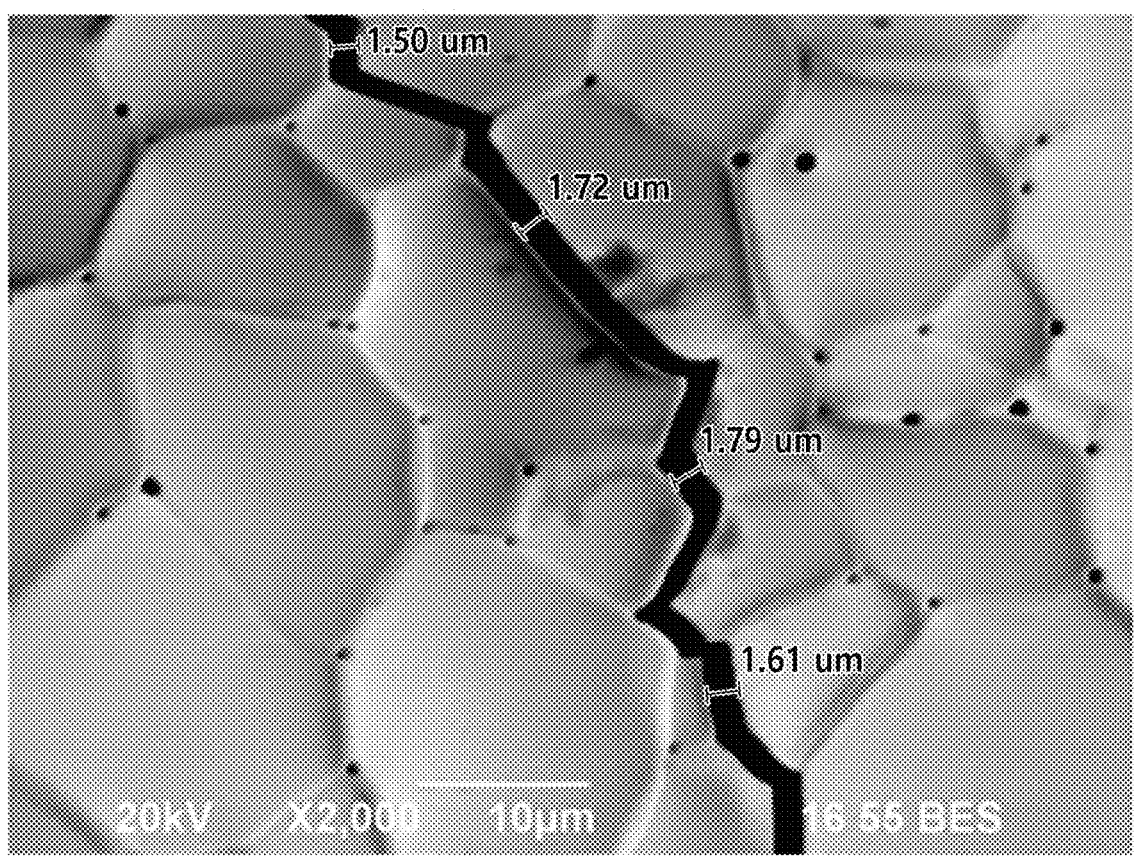
FIG. 4 is an image of measuring the width of microcracks in the tantalum carbide coating layer of Example 1 in the tantalum carbide-coated carbon material according to an embodiment of the present disclosure.

FIG. 4 is an image of measuring the width of microcracks in the tantalum carbide coating layer of Example 1 in the tantalum carbide-coated carbon material according to an embodiment of the present disclosure.

Referring to FIGS. 3 and 4, it may be confirmed that the width of microcracks generated in the tantalum carbide coating layer and the degree of damage to the carbon substrate after using the tantalum carbide-coated carbon material in the single-crystalline SiC growth process are remarkably reduced in the tantalum carbide-coated carbon material according to an embodiment of the present disclosure compared to the tantalum carbide-coated carbon material according to the conventional art. In particular, it may be confirmed that the degree of damage to the carbon substrate is reduced to about ½ of that of the tantalum carbide-coated carbon material according to the conventional art.

When the gap between microcracks generated in the tantalum carbide coating layer was measured in the vertical direction, the microcracks were measured to have a width level of 1.5 μm to 1.8 μm.

Figure 5:
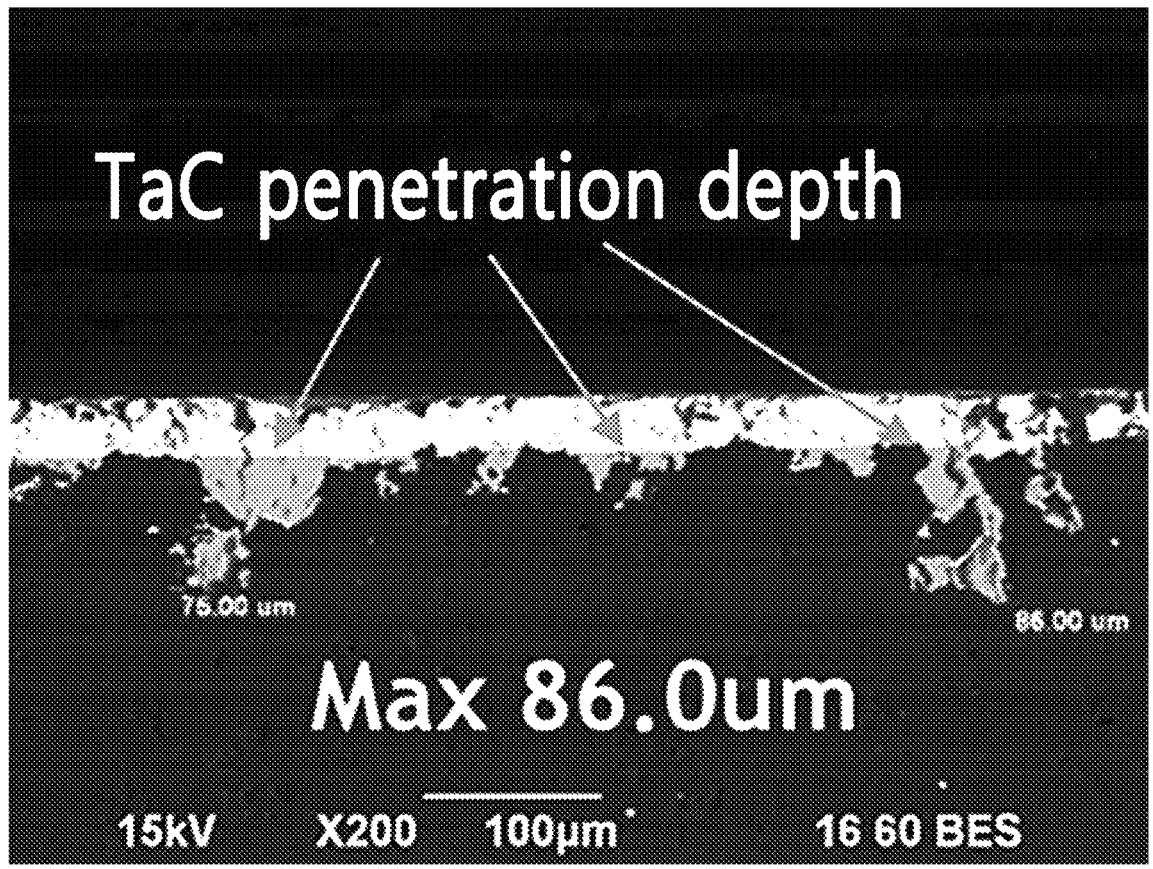
FIG. 5 is an image of measuring the penetration depth of a tantalum carbide penetrated into the carbon substrate in the tantalum carbide-coated carbon material according to an embodiment of the present disclosure.

FIG. 5 is an image of measuring the penetration depth of a tantalum carbide penetrated into the carbon substrate in the tantalum carbide-coated carbon material according to an embodiment of the present disclosure.

Referring to FIG. 5, when forming a tantalum carbide coating layer on the carbon substrate by the CVD method, it may be confirmed that the tantalum carbide penetrates into the carbon substrate through pores of the carbon substrate, and the penetrated tantalum carbide serves as the root of a plant, thereby increasing the adhesion between the carbon substrate and the tantalum carbide coating layer.

EXPERIMENTAL EXAMPLE 2

Observation of Changes in Width of Microcracks Depending on Changes in Thickness of Tantalum Carbide Coating Layer In order to observe the changes in the width of microcracks depending on the changes in the thickness of the tantalum carbide coating layer, widths of the generated microcracks were measured after manufacturing tantalum carbide-coated carbon materials by changing only the thickness of the tantalum carbide coating layer in a state that the surface roughness of the carbon substrate and the penetration depth of the tantalum carbide were constantly fixed.

The measurement results are shown in Table 1.

TABLE 1

| Classification | TaC Coating Thickness (μm) | Gr. Roughness (Ra, μm) | TaC Penetration Depth (μm) | Microcrack Width (Max, μm) |
|---|---|---|---|---|
| Example 1 | 15 | 2.0 | 60.1 | 1.81 |
| Example 2 | 25 | 2.0 | 60.1 | 2.01 |
| Example 3 | 35 | 2.0 | 60.1 | 2.53 |
| Comparative Example 1 | 38 | 2.0 | 60.1 | 3.61 |
| Comparative Example 2 | 50 | 2.0 | 60.1 | 5.01 |

Referring to Table 1, it may be confirmed that as the thickness of the tantalum carbide coating layer increases, the width of the microcracks also tends to increase.

EXPERIMENTAL EXAMPLE 3

Observation of Changes in Width of Microcracks Depending on Changes in Surface Roughness of Carbon Substrate In order to observe the changes in the width of the microcracks depending on the changes in the surface roughness (Ra) of the carbon substrate, widths of the generated microcracks were measured after manufacturing tantalum carbide-coated carbon materials by changing only the surface roughness (Ra) of the carbon substrate in a state that the thickness of the tantalum carbide coating layer and the penetration depth of the tantalum carbide were constantly fixed. For the surface roughness of the carbon substrate, the surface of the carbon substrate was observed at 50 magnification using a non-contact 3D measurement system with a laser microscope, and the roughness of the measurement area was measured (Model name: KEYENCE, VK-X1100, Program name: LS_Vkxz).

The measurement results are shown in Table 2.

TABLE 2

| Classification | TaC Coating Thickness (μm) | Gr. Roughness (Ra, μm) | TaC Penetration Depth (μm) | Microcrack Width (Max, μm) |
|---|---|---|---|---|
| Comparative Example 3 | 35 | 0.5 | 60.1 | 2.91 |
| Example 3 | 35 | 2.0 | 60.1 | 2.53 |
| Example 4 | 35 | 6.0 | 60.1 | 2.57 |

Referring to Table 2, it may be confirmed that as the surface roughness of the carbon substrate increases, the change width thereof is not large, but the width of the microcracks decreases.

EXPERIMENTAL EXAMPLE 4

Observation of Changes in Width of Microcracks Depending on Penetration Depth of Tantalum Carbide In order to observe the changes in the width of the microcracks depending on the changes in the penetration depth of the tantalum carbide, widths of the generated microcracks were measured after manufacturing tantalum carbide-coated carbon materials by changing only the penetration depth of the tantalum carbide in a state that the thickness of the tantalum carbide coating layer and the surface roughness of the carbon substrate were constantly fixed.

The measurement results are shown in Table 3.

TABLE 3

| Classification | TaC Coating Thickness (μm) | Gr. Roughness (Ra, μm) | TaC Penetration Depth (μm) | Microcrack Width (Max, μm) |
|---|---|---|---|---|
| Example 5 | 35 | 2.0 | 121.4 | 1.92 |
| Example 6 | 35 | 2.0 | 86.0 | 2.16 |
| Example 3 | 35 | 2.0 | 60.1 | 2.53 |
| Comparative Example 4 | 35 | 2.0 | 20.1 | 3.41 |

Referring to Table 3, it may be confirmed that as the penetration depth of the tantalum carbide increases, the width of the microcracks decreases.

EXPERIMENTAL EXAMPLE 5

Observation of Changes in Width of Microcracks Depending on Changes in Thickness of Tantalum Carbide Coating Layer Under Conditions of Improved Tantalum Carbide Penetration Depth Widths of the generated microcracks were measured after manufacturing tantalum carbide-coated carbon materials by constantly fixing the surface roughness of the carbon substrate and the penetration depth of the tantalum carbide under conditions that they were improved, and by varying each thickness of the tantalum carbide coating layer.

The measurement results are shown in Table 4.

TABLE 4

| Classification | TaC Coating Thickness (μm) | Gr. Roughness (Ra, μm) | TaC Penetration Depth (μm) | Microcrack Width (Max, μm) |
|---|---|---|---|---|
| Example 7 | 15 | 2.0 | 121.4 | 1.51 |
| Example 8 | 25 | 2.0 | 121.4 | 1.82 |
| Example 5 | 35 | 2.0 | 121.4 | 1.92 |

Referring to Table 4, it may be confirmed that when the tantalum carbide coating layer has a thickness range of 10 μm to 40 μm under conditions that the roughness of the carbon substrate and the penetration depth of the tantalum carbide are improved, the widths of the microcracks are further reduced.

EXPERIMENTAL EXAMPLE 6

Oxidation Test

In order to check the degree of damage to the carbon substrate due to the microcracks, an oxidation test was performed in an oxidation furnace. Specimens for respective conditions were fabricated and tested, and sizes of the test specimens were 20 mm×20 mm×2 t.

First, after performing heat treatment at 600° C. for 10 hours, the oxidation area was measured, and after performing heat treatment at 600° C. for 20 hours, whether the tantalum carbide coating layer had been peeled off or not was checked.

Figure 6:
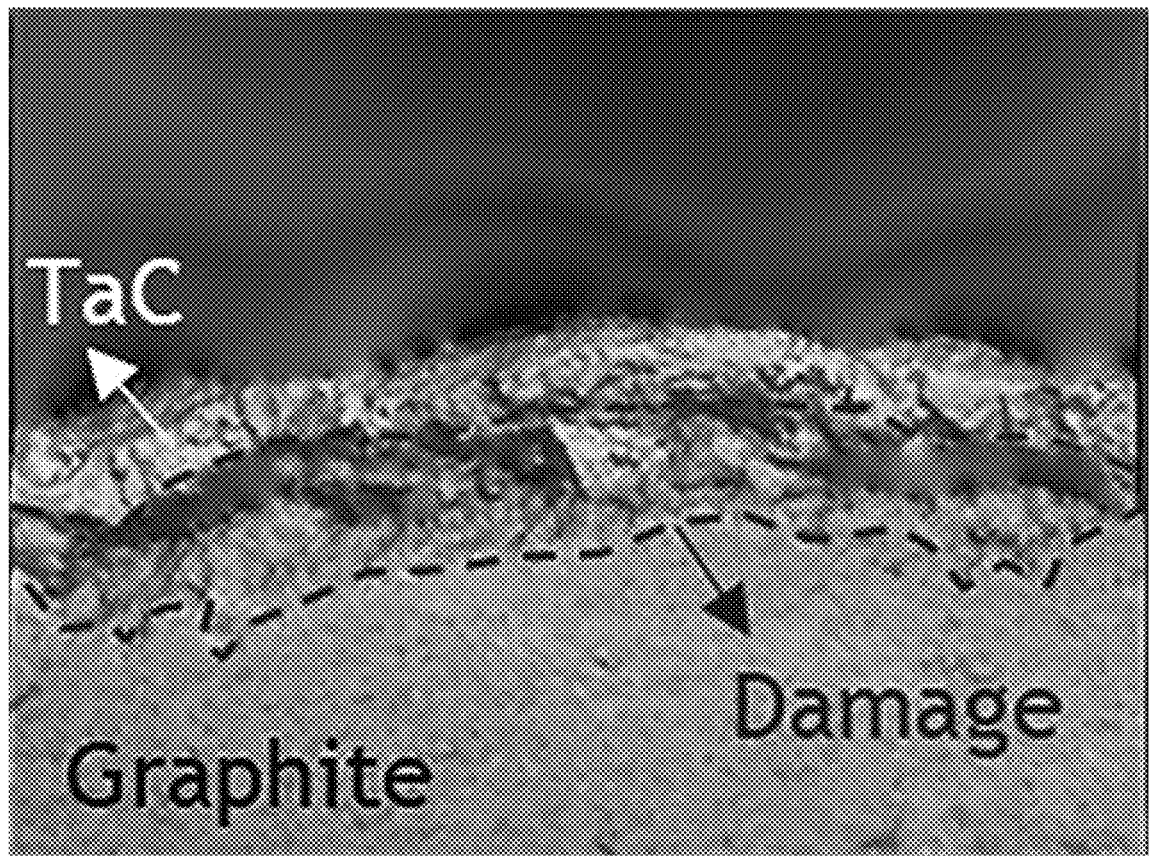
FIG. 6 is an image of observing an oxidation site with a laser microscope (×500 magnification) after an oxidation test (600° C., 10 hours) was performed on a tantalum carbide-coated carbon material of Comparative Example 1.

FIG. 6 is an image of observing an oxidation site with a laser microscope (×500 magnification) after an oxidation test (600° C., 10 hours) was performed on the tantalum carbide-coated carbon material of Comparative Example 1.

Figure 7:
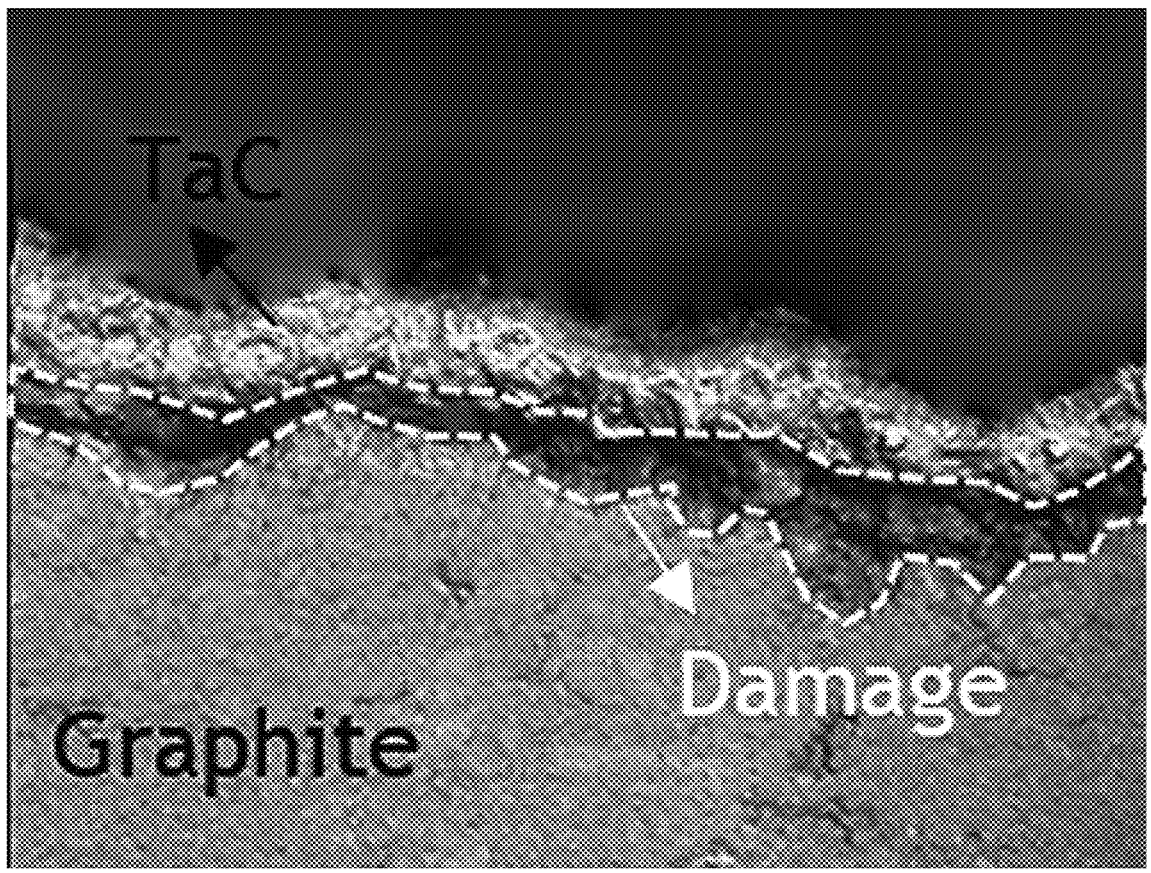
FIG. 7 is an image of observing an oxidation site with a laser microscope (×500 magnification) after an oxidation test (600° C., 10 hours) was performed on a tantalum carbide-coated carbon material of Example 1.

FIG. 7 is an image of observing an oxidation site with a laser microscope (×500 magnification) after an oxidation test (600° C., 10 hours) was performed on the tantalum carbide-coated carbon material of Example 1.

Here, the portion indicated by the dotted line corresponds to an oxidation area.

The image of the oxidation site was observed at ×500 magnification using a laser microscope, and the oxidation area was selected and calculated using a program (Model name: KEYENCE, VK-X1100, Program name: LS_Vkxz)

Referring to FIGS. 6 and 7, it may be confirmed that the oxidation area of Example 1 is remarkably smaller than that of Comparative Example 1.

Table 5 shows specific oxidation area measurement results, and Table 6 shows results of whether the tantalum carbide coating layers have been peeled off or not.

TABLE 5

| Classification | Microcrack Width (Max, μm) | Oxidation Area (μm2) |
|---|---|---|
| Example 1 | 1.81 | 2359 |
| Example 2 | 2.01 | 2578 |
| Example 3 | 2.53 | 2666 |
| Example 4 | 2.57 | 2680 |
| Example 5 | 1.92 | 2400 |
| Example 6 | 2.16 | 2603 |
| Example 7 | 1.51 | 2231 |
| Example 8 | 1.82 | 2340 |
| Comparative Example 1 | 3.21 | 3666 |
| Comparative Example 2 | 5.01 | 4550 |
| Comparative Example 3 | 2.91 | 3445 |
| Comparative Example 4 | 3.41 | 3529 |

TABLE 6

| Classification | Microcrack Width (Max, μm) | Whether TaC Coating layer is peeled off or not |
|---|---|---|
| Example 1 | 1.81 | Not peeled off |
| Example 2 | 2.01 | Not peeled off |
| Example 3 | 2.53 | Not peeled off |
| Example 4 | 2.57 | Not peeled off |
| Example 5 | 1.92 | Not peeled off |
| Example 6 | 2.16 | Not peeled off |
| Example 7 | 1.51 | Not peeled off |
| Example 8 | 1.82 | Not peeled off |
| Comparative Example 1 | 3.21 | Peeled off |
| Comparative Example 2 | 5.01 | Peeled off |
| Comparative Example 3 | 2.91 | Peeled off |
| Comparative Example 4 | 3.41 | Peeled off |

Referring to Table 5, it may be confirmed that as the size of the maximum width of the microcracks increases, the oxidation area also increases. That is, it may be seen that the size of the maximum width of the microcracks generated in the tantalum carbide coating layer determines the oxidation area.

Referring to Table 6, it may be seen that peeling of the tantalum carbide coating layer occurs when the size of the maximum width of the microcracks is 2.9 μm or more.

Although Examples have been described with reference to the limited drawings as described above, those skilled in the art may apply various technical modifications and variations based on the above description. For example, although the described techniques are performed in an order different from the described method, and/or the constituent elements such as the described system, structure, apparatus, circuit, etc. are coupled or combined in a form different from the described method, or replaced or substituted by other constituent elements or equivalents, appropriate results may be accomplished.

Therefore, other embodiments, other examples, and equivalents to the patent claim scope also belong to the scope of the claims to be described later.

What is claimed is:

1. A tantalum carbide-coated carbon material comprising:
   a carbon substrate; and
   a tantalum carbide coating layer formed on the carbon substrate,
   wherein microcracks included in the tantalum carbide coating layer have a maximum width of greater than 1.5 μm and 2.6 μm or less,
   wherein the carbon substrate includes surface pores, and is one in which a tantalum carbide is penetrated into the carbon substrate through the surface pores of the carbon substrate.

2. The tantalum carbide-coated carbon material of claim 1, wherein the carbon substrate includes one or more selected from the group consisting of graphene, and fullerene.

3. The tantalum carbide-coated carbon material of claim 1, wherein the carbon substrate has a thermal expansion coefficient of $4.0 \times 10^{-6}/°$ C. to $5.0 \times 10^{-6}/°$ C.

4. The tantalum carbide-coated carbon material of claim 1, wherein the carbon substrate has a surface roughness (Ra) of 0.6 μm to 10 μm.

5. The tantalum carbide-coated carbon material of claim 1, wherein the carbon substrate is surface-pretreated, and the pretreatment includes one or more selected from the group consisting of plasma treatment, ultrasonic treatment, acid treatment, sandblasting, and grinding treatment.

6. The tantalum carbide-coated carbon material of claim 1, wherein the tantalum carbide has a penetration depth of 30 μm to 150 μm.

7. The tantalum carbide-coated carbon material of claim 1, wherein the surface pores of the carbon substrate have a diameter of 1 μm to 50 μm.

8. A method for manufacturing a tantalum carbide-coated carbon material, the method comprising the steps of:
   preparing a carbon substrate; and
   forming a tantalum carbide coating layer on the carbon substrate by a CVD method,
   wherein microcracks included in the tantalum carbide coating layer have a maximum width of greater than 1.5 μm and 2.6 μm or less,
   wherein the carbon substrate includes surface pores, and is one in which a tantalum carbide is penetrated into the carbon substrate through the surface pores of the carbon substrate.

9. The method of claim 8, further comprising a step of pretreating a surface of the carbon substrate with one or more methods selected from the group consisting of plasma treatment, ultrasonic treatment, acid treatment, sandblasting, and grinding treatment after the step of preparing the carbon substrate.

10. The method of claim 8, wherein the tantalum carbide has a penetration depth of 30 μm to 150 μm.

* * * * *